(12) United States Patent
Barber et al.

(10) Patent No.: US 6,657,517 B2
(45) Date of Patent: Dec. 2, 2003

(54) MULTI-FREQUENCY THIN FILM RESONATORS

(75) Inventors: Bradley Paul Barber, Chatham, NJ (US); Peter Ledel Gammel, Milburn, NJ (US); LaRue Norman Dunkleberger, Kintnersville, PA (US)

(73) Assignee: Agere Systems, Inc., Allentown, PA (US)

( * ) Notice: Subject to any disclaimer, the term of this patent is extended or adjusted under 35 U.S.C. 154(b) by 32 days.

(21) Appl. No.: 10/028,191

(22) Filed: Dec. 20, 2001

(65) Prior Publication Data

US 2003/0117236 A1 Jun. 26, 2003

(51) Int. Cl.$^7$ .......................... H03H 9/205; H03H 9/56; H03H 3/04
(52) U.S. Cl. ................. 333/187; 333/189; 333/191; 29/25.35; 310/312
(58) Field of Search ................ 333/186–192; 29/25.35; 310/312, 320, 365, 366

(56) References Cited

U.S. PATENT DOCUMENTS

| | | | | | |
|---|---|---|---|---|---|
| 3,582,839 A | * | 6/1971 | Pim et al. | ...................... | 333/191 |
| 4,456,850 A | * | 6/1984 | Inoue et al. | .................. | 310/324 |
| 6,262,637 B1 | * | 7/2001 | Bradley et al. | .............. | 333/133 |
| 6,323,744 B1 | | 11/2001 | Barber et al. | ................ | 333/189 |
| 6,407,649 B1 | * | 6/2002 | Tikka et al. | .................. | 333/133 |
| 6,441,703 B1 | * | 8/2002 | Panasik | ...................... | 333/189 |
| 6,469,597 B2 | * | 10/2002 | Ruby et al. | ................... | 333/187 |
| 6,472,954 B1 | * | 10/2002 | Ruby et al. | ................... | 333/133 |
| 6,518,860 B2 | * | 2/2003 | Ellä et al. | .................... | 333/189 |

* cited by examiner

Primary Examiner—Barbara Summons
(74) Attorney, Agent, or Firm—Harness, Dickey & Pierce, P.L.C.

(57) ABSTRACT

Differing metallic electrodes having the same or differing thickness are formed at different locations on a support structure and/or on a single thickness film of piezoelectric material in order to form a multiple frequency resonator device having greatly separated acoustic resonance frequencies. A plurality of multiple frequency resonators can be combined to form a blank of frequency selective devices in order to handle the many different RF bands, at widely varying frequencies, that wireless communication technologies demand today.

25 Claims, 3 Drawing Sheets

MULTI-FREQUENCY THIN FILM RESONATORS

BACKGROUND OF THE INVENTION

1. Field of the Invention

The present invention generally relates to acoustic devices and more particularly to a method of manufacturing multiple frequency resonator devices.

2. Description of Related Art

Wireless communication devices are utilizing an ever-increasing number of frequency bands, such as PCS frequencies for cell phones, GPS frequencies for location, and ISM frequencies for data or other utilities. Sometimes, a user would want to communicate across many bands from one device, perhaps even through a single antenna. For instance, a single cell phone could provide phone service at 900 MHz and utilize a Bluetooth radio at 2400 MHz to provide a hands-free, wireless link to a headset. Therefore frequency selection devices (such as filters or resonators used in voltage controlled oscillators) will be required to manipulate different RF bands, at widely varying frequencies, preferably within a single device.

Ideally these frequency selection devices would be integrated "on chip" with active circuit elements such as transistors in an effort to develop a "single chip radio" solution. Such integration is driven by a desired increase in capability and performance, coupled with a desired reduction in size and part-count of such a device.

One technology that is a leading candidate for on-chip frequency selection is thin-film, bulk acoustic wave, RF-filter technology. At the heart of this technology, a piezoelectric thin film is placed between conducting electrodes to form a thin film resonator (TFR). Frequency selection is done acoustically. For example, a circuit provides an RF signal to introduce sound waves into the piezoelectric film, and the mechanical resonance of the sound waves in-turn affects the electrical properties seen by the circuit.

TFRs are often used in electronic signal filters, more particularly in TFR filter circuits applicable to a myriad of communication and microelectronic technologies. For example, TFR filter circuits may be employed in the aforementioned cellular, geo-location and data communications, as well as in wireless and fiber-optic communications, computer or computer-related information-exchange or information-sharing systems.

As briefly noted above, the piezoelectric material in these TFRs converts electrical to mechanical energy and vice versa, such that at its mechanical resonance frequency, the electrical behavior of the device abruptly changes. Electrical signals of particular frequencies easily pass thorough the resonators, while others will not be transmitted. These particular frequencies can typically be dictated by choosing resonator size and design. Resonators of certain sizes and design frequencies can be networked in appropriate combinations, such that they will impose desired filtering functions on signals passing through the network.

Accordingly, as a TFR is an acoustically resonant device, the thickness and material properties of the piezoelectric film, together with the thickness and material properties of the electrode films in intimate contact with the piezoelectric film, determine at what frequency the resonance will occur. Conventionally, to build a device for frequency selection at multiple and quite separated, frequencies, the artisan typically deposited multiple piezoelectric films of quite different thicknesses on a substrate and/or electrode film. These multiple depositions were costly and also posed a formidable process control challenge, since the films required are quite specialized—they all had to be composed of a piezoelectric material.

Further, conventional manufacturing techniques have used different metals in order to fabricate single-frequency resonators, but have not used combinations of metals for well-separated frequency operations on a single die, with a single piezoelectric layer.

SUMMARY OF THE INVENTION

In accordance with the present invention, there is a method of forming a multiple frequency resonator device having a single piezoelectric layer. In one aspect, differing metallic electrodes or differing thickness electrodes are formed at different locations on a support structure and/or on a single thickness film of piezoelectric material. The resultant device contains multiple frequency resonators having greatly separated acoustic resonance frequencies therethrough. These multiple frequency resonators can then be combined to form a bank of frequency selective devices in order to handle the many different RF bands, at widely varying frequencies, that wireless communication technologies demand today.

BRIEF DESCRIPTION OF THE DRAWINGS

The present invention will become more fully understood from the detailed description given hereinbelow and the accompanying drawings, wherein like elements are represented by like reference numerals, which are given by way of illustration only and thus are not limitative of the present invention and wherein.

DETAILED DESCRIPTION

Figure 1:
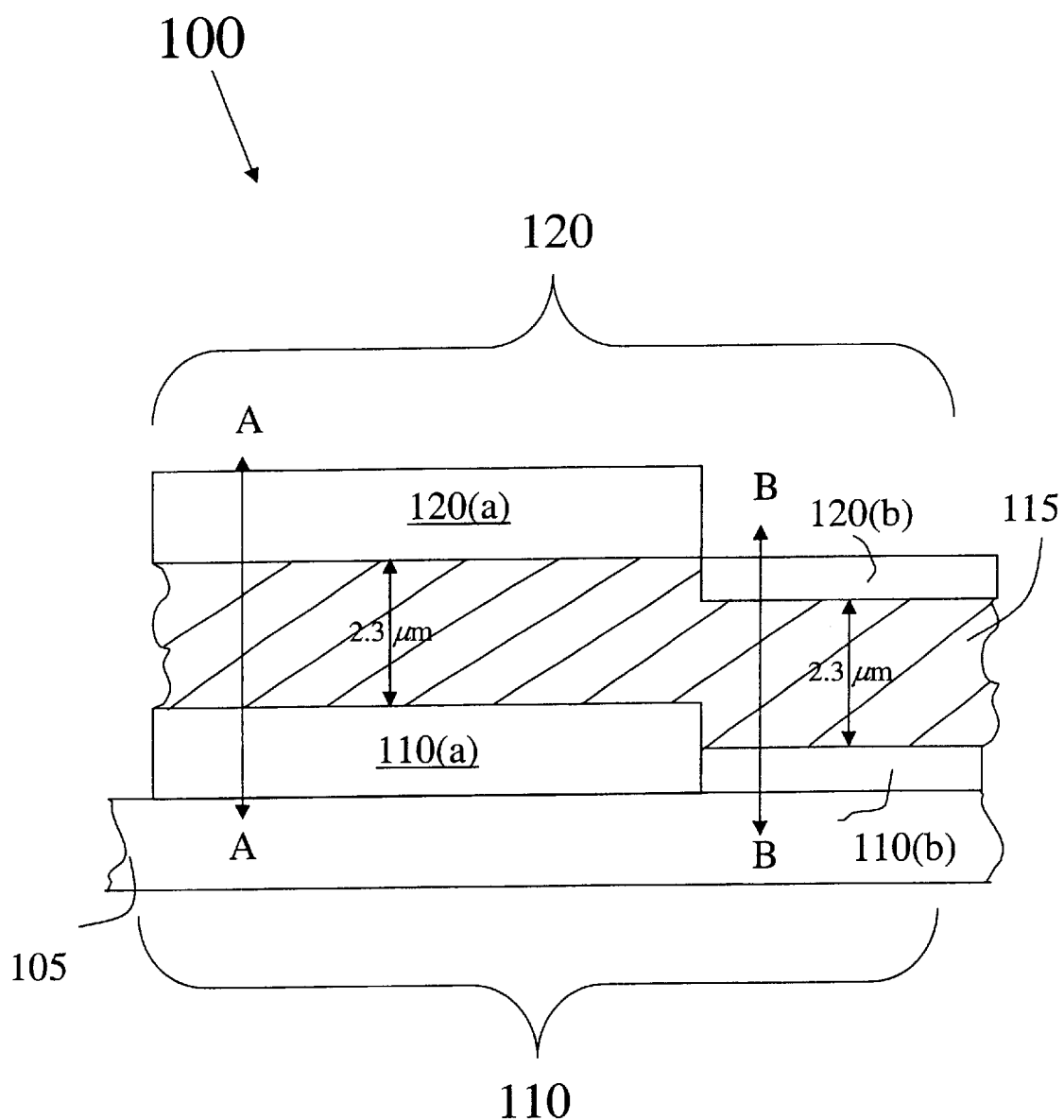
FIG. 1 illustrates a cross-section of an exemplary resonator device constructed in accordance with the invention.

The method of the present invention provides a multiple frequency resonator device having a single piezoelectric film layer. In one aspect, differing metallic electrodes or differing thickness electrodes are formed at different locations on a support structure and/or on a single thickness film of piezoelectric material. The resultant device is a multiple frequency resonator having greatly separated acoustic resonance frequencies therethrough.

An acoustic resonator typically contains a piezoelectric film in order that applied electrical signals will be affected by the mechanical resonances of the structure. The structure is loosely defined by any part of the device in which acoustic energy will be found. The acoustic energy is transduced from electrical energy in the piezoelectric layer, but will transmit to any accompanying layers. To keep the energy located where it is desired for low loss and proper resonances, reflections are carefully engineered. The acoustic reflection between a solid surface and air is quite good; most of the energy is reflected. So one way to trap the energy in the structure is to fabricate a suspended membrane of piezoelectric film with air on both sides. An alternative approach to trapping the energy in a resonator is to use an acoustic mirror, as described in co-pending U.S. patent application Ser. No. 09/576,807 to Barber et al. entitled "ACOUSTIC MIRROR MATERIALS FOR ACOUSTIC DEVICES", filed May 23, 2000, the contents of which are hereby incorporated by reference herein in their entirety.

As electrical signals must be applied through a metal film, metal films should be placed on each side of the piezoelectric film. Because of the intimate contact between the piezoelectric and metal films, the metal will contain acoustic energy and its properties will affect the resonance frequencies of the device. In the case of using an acoustic mirror, the metallic electrodes on both an air side and a mirror side of the piezoelectric film will have an effect on the resonance frequencies of the structure.

In a simplified view, the resonances are found where a sound wave will traverse an acoustic mirror stack, reflect off a far boundary and return to the place of origin in one period of the excitation frequency. Accordingly, if materials of differing properties are assembled in the stack to be traversed by sound, the transit time will change. In addition, using differing materials in a layered acoustic mirror stack will cause partial reflections to occur inside the stack, so that there are corrections to the simple transit time discussion above.

These partial reflections are regulated by differences in acoustic impedance (the product of speed and density in a material.) The partial reflections affect at what frequency the strongest coherent addition of waves occurs. Thus, one result is that even thin layers of very dense electrodes can cause dramatic changes in the resonance frequencies of the structure. The inventors have discovered that it is feasible to make resonators that have very different resonance frequencies on the same substrate, by using differing metals of differing thickness for the electrodes.

These multiple frequency resonators can then be combined to make a desired or required bank of frequency selective devices. The density of the added electrode material has a pronounced effect on resonance frequency. Specifically, heavier metals shift the frequency down more per unit thickness. Thus, it can be shown that the varying frequencies required in an RF device today may be fabricated on a single thickness piezoelectric film such as aluminum nitride, so long as the electrode densities and piezoelectric film thickness are appropriately chosen through empirical evidence gained from experimentation. If the number of resonators in a device is so numerous that a single layer of piezoelectric material, combined with a plurality of varying metal regions, becomes overly complex, the use of multi-metal, multi-thickness regions can still be used to reduce the number of different thickness piezoelectric layers that are needed in the device.

FIG. 1 illustrates a cross-section of an exemplary resonator device constructed in accordance with the invention. As shown in FIG. 1, there is a device 100 that has a lower electrode layer 110 (indicated by regions 110(a) and 110(b)) formed on a support structure 105. A piezoelectric thin film layer 115 is formed on the layer 110, and an upper electrode layer 120 (indicated by regions 120(a) and 120(b)) is formed on the piezoelectric thin film layer 115. The support structure 105 may be a silicon wafer on which the devices are fabricated, which is then at least locally removed to leave a membrane structure. Alternatively, support structure 105 may be embodied as a plurality of alternating reflecting layers on a solid semiconductor substrate, which may be made of silicon or quartz, for example.

The piezoelectric material of piezoelectric thin film layer 115 is preferably selected from the group comprising at least ZnO, CdS and AlN. Typically, electrode layers were formed of a single thickness from a single conductive material. And, possibly, very small amounts of additional metal were placed on top of some resonators to shift a selected number of resonators' frequencies a few percent in frequency. This was done to provide a wider filter response across a single frequency band, such as is used for a PCS band-pass filter.

In the present application the electrode layers are composed of different metals, each at different thickness. This provides dramatically differing frequencies that can be used for frequency control or filtering at frequencies as different as 900 MHz and 9000 MHz using, for example, a single layer of piezoelectric film having a substantially uniform thickness, for example.

In the embodiment of FIG. 1, the piezoelectric layer 115 is deposited as a single 2.3 micron ($\mu$m) thick film of aluminum nitride (AlN). At regions annotated by line A—A in FIG. 1, the electrode layers 110(a) and 120(a) are each formed of a thickness of about 0.65 microns of molybdenum (Mo), with its high density of 10200 kg/m$^3$. With this arrangement, i.e., the regions along line A—A where the AlN is bounded by Mo, the resultant device at that location is a resonator that is produced at 900 MHz.

In another region of device 100 in FIG. 1, and having the same thickness of AlN layer 115, another electrode material and thickness is used for electrode layers 110(b) and 120(b). In this region, annotated by line B—B in FIG. 1, Al (with its density of 2700 kg/m$^3$) at a thickness of about 0.25 microns above and below the AlN is used as electrode material, instead of the higher density Mo. This Al/AlN region B—B therefore produces resonators at 1900 MHz.

Accordingly, FIG. 1 illustrates that by making a proper choice of metals and thicknesses for electrodes, a multiple frequency resonator with frequencies differing by a great amount can be fabricated, having only a single piezoelectric film layer. The difference in thickness between the two or more metals in a single layer level may be from an almost negligible difference to a thickness difference of several microns, depending on the desired application and desired frequency range. Preferably, the thickness difference between the two or more metals on a single layer level is about 0.30 microns or more.

The use of equal thickness metals above and below the piezoelectric film layer is not required, nor is the use of a single metal or the same material above and below. It is preferable however to have sufficient metal in contact with the piezoelectric film layer in order to reduce the resonant frequency at that area to a desired resonant frequency. Other metals used in thin film processing could be used for making multi-frequency resonators. For example, tungsten with a high density of 19100 kg/m$^3$ and titanium with a lower density of 4510 kg/m$^3$ are two metals which exhibit sufficiently low acoustic loss, have acceptable conductivity, and are readily processed as films.

Figure 2:
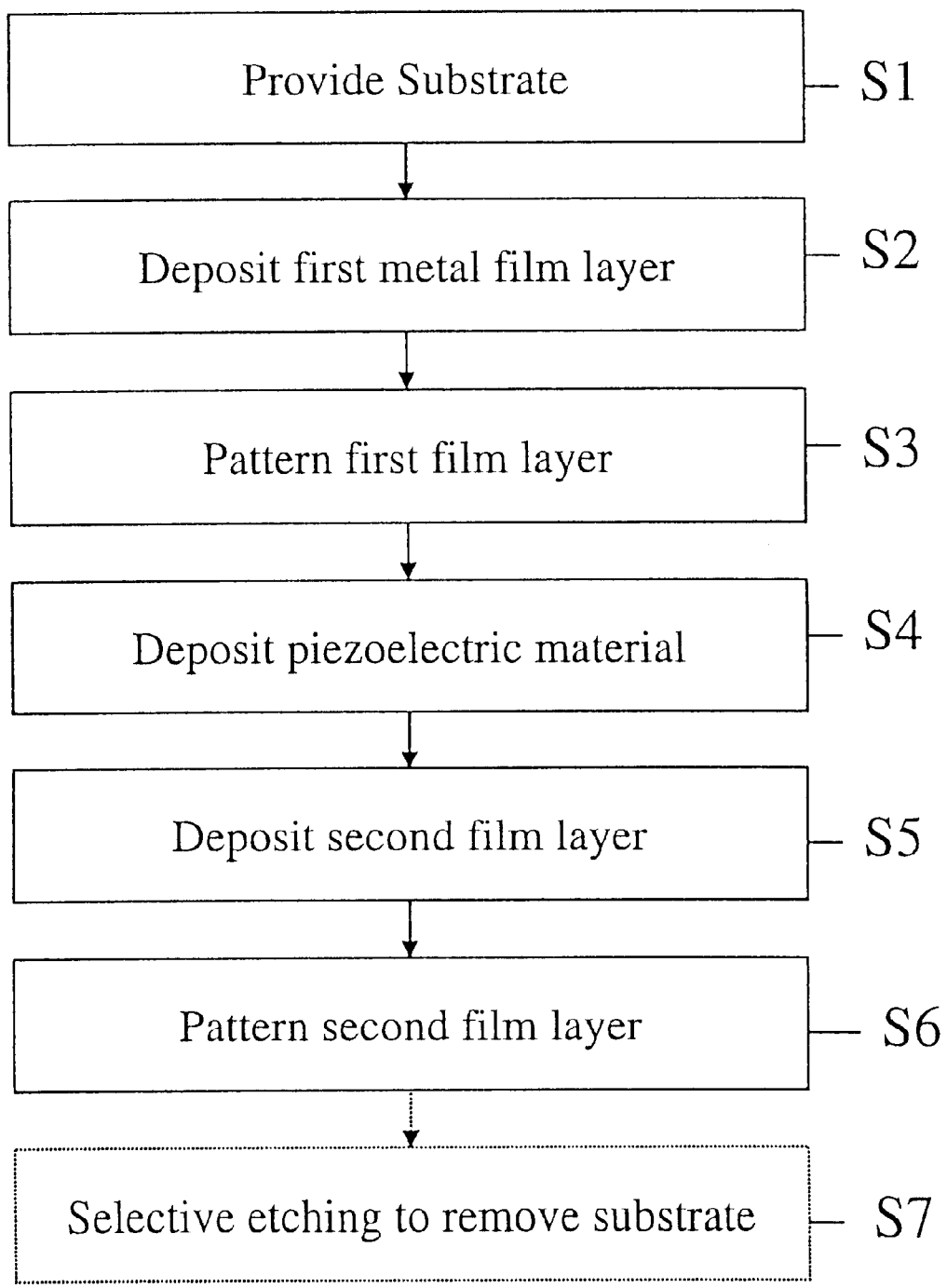
FIG. 2 illustrates the method of manufacturing a multi-frequency resonator device in accordance with an embodiment of the invention.

FIG. 2 illustrates the method of manufacturing a multi-frequency resonator device in accordance with the invention. Though there can be a variety of thin film process steps involved in the batch fabrication of a multi-frequency device (as there is in fabricating any modem integrated circuit or electronic device), the vast majority of these processes involve repeated applications of three primary operations: deposition, lithography, and etching.

Referring to FIG. 2, initially a base support structure such as a substrate is provided (step S1). The base structure is often not integral to device operation; it provides only mechanical support and in some cases is in fact removed to yield a membrane structure. The base structure in the present embodiment, hereinafter "substrate", is preferably a silicon wafer substrate. Alternatively, the substrate may include a plurality of alternating reflecting layers of acoustically mismatched materials such as $SiO_2$ and AlN that are deposited on a wafer substrate of silicon, quartz, or glass wafer.

After providing the substrate, a first thin multi-metal film layer (of varying thickness) is deposited on the substrate surface (step S2). This deposition may preferably be performed separately for each metal in a vacuum chamber using one of the above-described plurality of thin-film deposition techniques. In the present embodiment, this multi-metal composite film layer acts as a bottom surface electrode for the device and is composed of differing metals at different thicknesses, i.e., as illustrated in FIG. 1, but other conductors may be used as well.

Once the first thin multi-metal film layer has been deposited, it undergoes a patterning process (step S3). A lithographic process is employed in which a thin layer of a photo-sensitive, chemically-resistant polymer, or "photo resist", is applied to completely coat the metal film. Exposure to light through a "photo mask", a material or masking layer that has holes or openings at certain locations for light to pass, sensitizes the photo resist such that subsequent immersion in a developer removes only that resist material that was subject to the light. At this point, the sample surface consists of regions where the protective resist layer remains, and regions of un-protected metal.

The extent or nature of this patterning process may be based on the desired application; i.e., in RF filter or TFR applications, this patterning is determined by the design of the desired or required filter. Accordingly, steps S2 and S3 may be repeated as needed for a desired application.

The base or bottom electrode patterning process continues with the transfer of this lithographically-defined pattern into the metal layer via an etching process. A number of etching techniques are routinely practiced in the art, including wet chemical etching (hydrofluoric acid for example will etch Al), dry or reactive ion etching (RIE) provides electronically excited chemical gas to remove material, and sputter etching where gases are accelerated and bombard the material to be removed. Such processes, through either chemical or physical action, remove any metal which is unprotected by the photo resist, while leaving the resist-coated metal intact, thereby "sculpting" the metallic surface into the desired electrode pattern or thicknesses.

The desired area patterns of Mo or Al from the device in FIG. 1 can be attained with these processes, for example. As noted above, steps S2 and S3 can be repeated as needed to define all the distinct regions of differing thickness, differing metals, so as to yield the desired number of different frequency resonators.

The semi-completed device is then returned to the vacuum chamber for the deposition of an active piezoelectric material film (step S4). Similar to the metal deposition alternatives listed above, the piezoelectric layer can be deposited in different ways, such as through RF sputtering of an insulating target, pulsed DC reactive sputtering of a metallic target, chemical vapor deposition (CVD) and molecular beam epitaxy (MBE) for example. This piezoelectric material is preferably Aluminum Nitride (AlN) as in the presently described embodiment, but may also be composed of ZnO or CdS for example.

The piezoelectric film is subsequently coated with the appropriate second thin multi-metal film layers in the appropriate areas, so as to form the top electrode of the device (step S5). This second multi-metal film is patterned and etched (step S6) with the lithographic process as described above in step S3. Once the photo resist is removed, the structure of the device is essentially complete. Again steps S5 and S6 may be repeated for each metal and thickness require to make the multitude of differing frequency regions.

After choosing the desired metals and determining the desired thickness, an optional final step in a resonator device's fabrication (illustrated in dotted line fashion in FIG. 2) consists of masking the substrate for selective removal of at least some, or even all of the substrate material underlying the device. After masking, the exposed Si may be etched with either wet (KOH, for example), dry etching such as XeF2 or dry (RIE) chemistry (step S7). This Si etch terminates on the initially-deposited etch-resistant film or a film which is integral to device operation (i.e., AlN, SiN or ZnO for example), as is appropriate for the desired device or application. This etching may also be applicable to selected portions of both electrode layers, if necessary, in an effort to attain the desired variable electrode thicknesses in order to provide a multi-frequency device.

It should be understood that depending on the specific set of frequencies required, the differing frequency resonators can share a common metal of common thickness on one side and differing metals of differing thickness on the other. As the number of differing frequencies that are desired increases, the artisan or designer may chose the appropriately needed number of differing thickness and metals such that in the appropriate combination of top and bottom metals, each desired frequency may be achieved.

Of course, to pattern the metals appropriately, selective etching between these metals will be desirable so that all appropriate combinations can be made. This selectivity can be achieved similar to the manner discussed in U.S. Pat. No. 6,307,447 to Barber et al., entitled "TUNING MECHANICAL RESONATORS FOR ELECTRICAL FILTER", the contents of which are hereby incorporated by reference herein in their entirety.

In the present invention, a resonator having vastly differing frequencies, perhaps differing by a factor of at least 2 or more, and preferably differing by a factor in the range of about 2–5, is desired. In the above patent, resonators are shifted only slightly to provide percentage bandwidth shifts, in order to widen a filter across a narrow frequency band. As a special case of the present invention, the designer can use the same metal in differing thickness depositions as needed to provide different frequencies. In the same way, a single thickness metal could be etched in chosen areas to reduce its thickness at those chosen areas.

Figure 3:
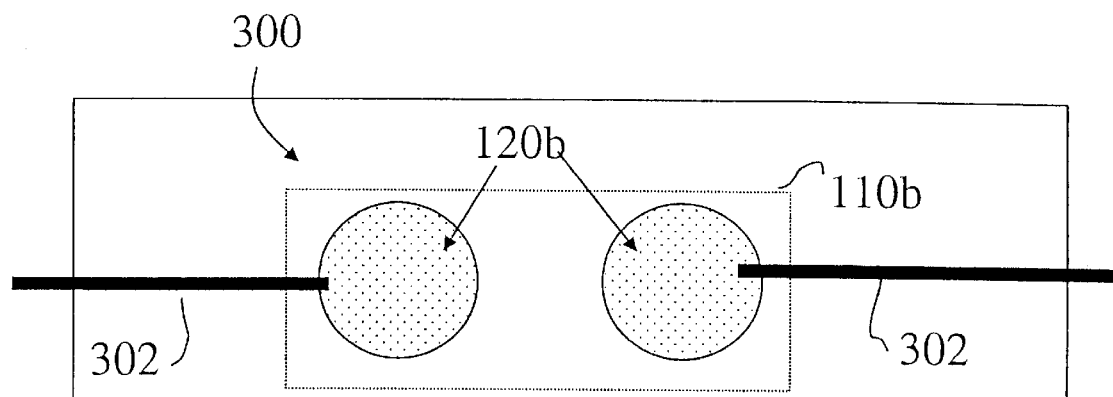
FIG. 3 illustrates an exemplary bank of frequency selective devices formed from the resonators of FIG. 1.
Figure 3:
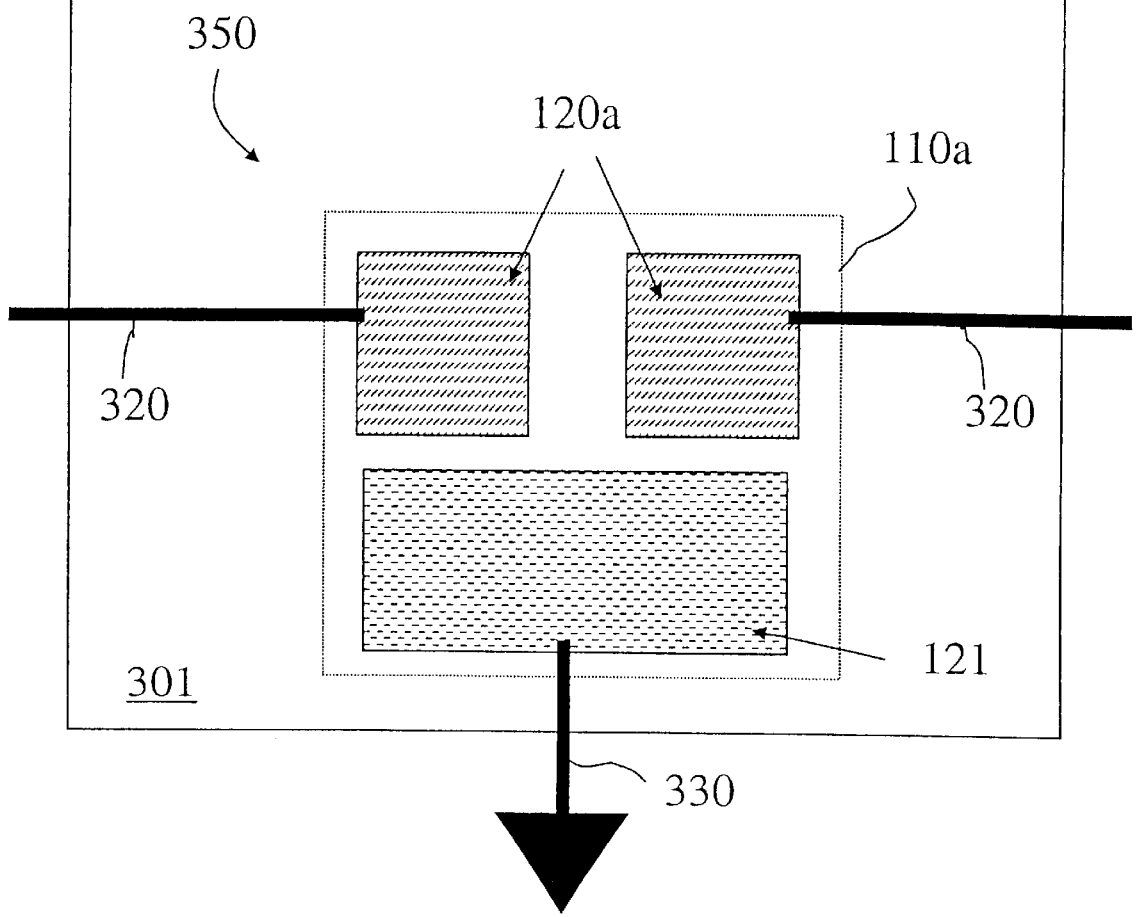

FIG. 3 illustrates an exemplary bank of frequency selective devices formed from the resonators of FIG. 1. As shown in FIG. 3, on a common substrate 301 there is a resonator 300 and a filter 350. The resonator 300 consists of top electrodes 120b, base electrode 110b, and electrical connections 302. Filter 350 consists of electrical connections 320, top series electrodes 120a, top shunt electrode 121 and base electrode 110a. The resonator 300 and filter 350 are fashioned on the same substrate 301 for making multi-frequency devices on a single chip.

In this example, resonator 300 could be used for frequency control at 1900 MHz by using the thicknesses discussed for 1900 MHz devices in FIG. 1, and the filter 350 could be fabricated as a 900 MHz filter using the thicknesses discussed above in making 900 MHz filters in FIG. 1.

The invention being thus described, it will be obvious that the same may be varied in many ways. Such variations are not to be regarded as departure from the spirit and scope of the invention, and all such modifications as would be obvious to one skilled in the art are intended to be included within the scope of the following claims.

What is claimed is:

1. A method of producing a multi-frequency resonator device, comprising:
   forming a first metal film region on a substrate;
   forming at least one additional metal film region on the substrate;
   forming a piezoelectric layer on said first and additional metal film regions; and
   forming metal films above the first and additional metal films regions and on the piezoelectric layer,
   the device having at least two different resonant frequencies differing by a factor of at least two.

2. The method of claim 1, wherein the first metal film region and at least one additional metal film region have different thicknesses.

3. The method of claim 2, wherein a thickness difference between the first metal film region and at least one additional metal film region is at least about 0.30 microns or more.

4. A bank of frequency selective devices, comprising a plurality of multi-frequency resonator devices formed by the method of claim 1.

5. The bank of frequency selective devices according to claim 4, the plurality of multi-frequency resonator devices are provided on a single semiconductor chip.

6. The method of claim 1, wherein the at least two different resonant frequencies differ by a factor in a range of between about 2 and 5.

7. The method of claim 1, said first and additional metal film regions being composed of different metals, at least one of the metals having a high density and the other metal having a low density.

8. The method of claim 7, wherein said metal having a high density is selected from either Mo or W, and said metal having a low density is selected from Al or Ti.

9. The method of claim 1, wherein said piezoelectric layer is a single layer of substantially uniform thickness.

10. The method of claim 1, further comprising performing a series of forming processes to shape the substrate, to build-up metal film layers formed from said first and additional metal film regions and to shape a piezoelectric layer of the device.

11. The method of claim 10, further comprising removing at least a portion of the substrate or other layers by a selective etching process.

12. The method of claim 11, wherein said step of removing by selective etching further includes masking one or more of the layers for selective removal of at least a portion of one of the layers, and then etching any exposed substrate, metal film region and/or piezoelectric layer portions using at least one process selected from a potassium hydroxide (KOH) process, reactive ion etching (RIE) process or dry etching process.

13. The method of claim 1, wherein said first and additional metal film regions metal films are formed as electrodes by lithographic patterning of the metals therein.

14. The method of claim 1, wherein said substrate is a wafer formed of silicon, quartz, or glass.

15. The method of claim 1, wherein said piezoelectric layer is selected from the group comprising at least AlN, CdS and ZnO.

16. The method of claim 1, wherein said piezoelectric layer is applied by a thin film deposition process selected from one of physical vapor deposition (PVD) process, chemical vapor deposition (CVD) process or thermal evaporation Process.

17. A multi-frequency resonator device, comprising:
   a substrate;
   a first metal film layer provided on the substrate, said first metal film composed of multiple metal regions that provide the device with at least two different resonant frequencies differing by a factor of at least two, each metal region having a thickness;
   a piezoelectric layer provided on said first metal film; and
   a second metal film layer provided on the piezoelectric layer.

18. The multi-frequency resonator device of claim 17, the first metal film layer having at least a first metal region and second metal region, a thickness of the first metal region differing from a thickness of the second metal region.

19. The multi-frequency resonator device of claim 18, wherein a thickness difference between the first metal region and the second metal region is at least about 0.30 microns or more.

20. The multi-frequency resonator device of claim 17, the second metal film layer having at least a first metal region and second metal region, a thickness of the first metal region differing from a thickness of the second metal region.

21. The multi-frequency resonator device of claim 20, wherein said first and second metal film layers are electrodes formed by lithographic patterning of the metals therein.

22. The multi-frequency resonator device of claim 17, wherein the at least two different resonant frequencies differ by a factor in a range of between about 2 and 5.

23. The multi-frequency resonator device of claim 17, said first and second metal regions being composed of different metals, at least one of the metals having a high density and the other metal having a low density.

24. The multi-frequency resonator device of claim 23, wherein said metal having a high density is selected from either Mo or W, and said metal having a low density is selected from Al or Ti.

25. The multi-frequency resonator device of claim 17, wherein said piezoelectric layer is a single layer of a substantially uniform thickness.

* * * * *